United States Patent
Tanaka et al.

(10) Patent No.: US 7,643,126 B2
(45) Date of Patent: Jan. 5, 2010

(54) METHOD OF SETTING FOCUS CONDITION AT TIME OF EXPOSURE, APPARATUS FOR SETTING FOCUS CONDITION AT TIME OF EXPOSURE, PROGRAM, AND COMPUTER READABLE RECORDING MEDIUM

(75) Inventors: Michio Tanaka, Koshi (JP); Masahide Tadokoro, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 452 days.

(21) Appl. No.: 11/362,126

(22) Filed: Feb. 27, 2006

(65) Prior Publication Data

US 2006/0199090 A1    Sep. 7, 2006

(30) Foreign Application Priority Data

Mar. 3, 2005    (JP) ............................. 2005-059590

(51) Int. Cl.
*G03B 27/42*    (2006.01)
(52) U.S. Cl. ........................... 355/53; 430/30; 430/311; 430/322; 430/327; 430/935
(58) Field of Classification Search .................. 355/18, 355/30, 52, 53, 55, 67; 430/5, 19, 30, 22, 430/77, 296, 311, 330
See application file for complete search history.

(56) References Cited

U.S. PATENT DOCUMENTS 6,410,194 B1 *   6/2002   Yoshihara ................... 430/30

7,049,617 B2 *   5/2006   Iriguchi ...................... 250/548
2005/0030502 A1 *   2/2005   Fujisawa et al. ............. 355/53

OTHER PUBLICATIONS

Masafumi Asano, et al., "CD Control with Effective Exposure Dose Monitor Technique in Photolithography", Proc. of SPIE, vol. 4691, 2002, pp. 280-284.
Alexander Starikov, "Exposure Monitor Structure", SPIE, Integrated Circuit Metrology, Inspection, and Process Control IV, vol. 1261, 1990, pp. 315-324.

* cited by examiner

*Primary Examiner*—Diane I Lee
*Assistant Examiner*—Mesfin T Asfaw
(74) *Attorney, Agent, or Firm*—Oblon, Spivak, McClelland, Maier & Neustadt, L.L.P.

(57) ABSTRACT

In the present invention, in the photolithography process in which a certain focus condition has been already set, a film on a substrate is exposed to only zero-order light of a light source transmitted, and then developed to reduce a first portion of the film on the substrate. Further, the film on the substrate is exposed to zero-order light and higher order light of the light source transmitted, and then developed to reduce a second portion of the film on the substrate. Thereafter, the film thicknesses of the first portion and the second portion are measured, and the measured film thicknesses of the first portion and the second portion are converted into line widths of a resist pattern by previously obtained correlations between the film thicknesses and the line widths. The converted line width of the second portion is then subtracted from the converted line width of the first portion, whereby the line width depending only on the focus component is calculated. Based on the line width, a new focus condition is set.

17 Claims, 14 Drawing Sheets

$$Pt < \frac{\lambda}{NA \cdot (1+\sigma)} \quad \cdots (1)$$

$$\Delta CD = M \cdot \Delta F \quad \cdots (2)$$

METHOD OF SETTING FOCUS CONDITION AT TIME OF EXPOSURE, APPARATUS FOR SETTING FOCUS CONDITION AT TIME OF EXPOSURE, PROGRAM, AND COMPUTER READABLE RECORDING MEDIUM

BACKGROUND OF THE INVENTION

1. Field of the Invention

The present invention relates to a method of setting a focus condition at the time of exposure, an apparatus for setting a focus conditions at the time of exposure, a program, and a computer readable recording medium.

2. Description of the Related Art

In a photolithography process in a manufacturing process of a semiconductor device, a plurality of processing and treatments are sequentially performed, for example, resist coating treatment in which a resist film is formed by applying a resist solution onto a wafer surface; exposure processing in which light in a predetermined pattern is applied to the resist film on the wafer to thereby expose the wafer to the light; heat-processing after the exposure which promotes chemical reaction in the resist film (post-exposure baking); developing treatment in which the exposed resist film is selectively dissolved with a developing solution, and so on, so that a predetermined pattern is formed in the resist film on the wafer.

Incidentally, it is necessary to form, on the wafer, the resist pattern with line widths having a uniform predetermined dimension within the wafer. Further, the line width of the resist pattern is greatly affected by exposure conditions such as the exposure amount, focus, and so on at the time of exposure processing in the photolithography process. Hence, it has been conventionally performed that the line width of the resist pattern formed on the wafer has been measured and the focus condition at the time of exposure has been set based on the measurement result (Japanese Translated National Publication of Patent Application No. 2001-534652 and Japanese Patent Application Laid-open No. 2003-86497).

In the aforementioned line width measurement, however, it is necessary to use a so-called electronic CD-SEM (Scanning electron microscope) which measures the line width by applying electron beams to the wafer. In this case, a large quantity of electrons collide against the wafer and may damage, for example, the resist pattern on the wafer. Therefore, the sufficient accuracy of the line width measurement is not ensured, causing difficulties to ensure the sufficient accuracy for the setting of the exposure conditions performed based on the result of the line width measurement. In addition, the line width measurement by the CD-SEM suffers from a disadvantage of consuming much time.

Besides, causes of variations in the line width of the resist pattern within the wafer include a variation component resulting from the exposure amount (dose of light) and a variation component resulting from focus at the time of exposure. The setting of the focus condition at the time of exposure has been conventionally performed based on the measurement result of the line width including both of the components, and therefore the setting has not been accurately performed. Therefore, the sufficient uniformity of the line width within the wafer cannot be secured.

SUMMARY OF THE INVENTION

The present invention has been developed in consideration of the above viewpoint, and its object is to detect an optimum line width required to set a focus condition at the time of exposure quickly and accurately to set the focus condition more accurately.

To achieve the above object, the present invention is a method of setting a focus condition at the time of exposure in a photolithography process of forming a resist pattern on a substrate, including the steps of: exposing a film on the substrate to light using a mask having a first pattern transmitting only zero-order light of a light source and then developing the film to reduce a first portion of the film on the substrate in the photolithography process in which a certain focus condition has been already set;

exposing the film on the substrate to light using the mask having a second pattern transmitting zero-order light and higher order light of the light source and then developing the film to reduce a second portion of the film on the substrate in the photolithography process in which the certain focus condition has been already set;

measuring film thicknesses of the first portion and the second portion;

converting the measured film thickness of the first portion and the measured film thickness of the second portion into line widths of the resist pattern by previously obtained correlations between the film thicknesses and the line widths;

subtracting the converted line width of the second portion from the converted line width of the first portion; and setting a new focus condition based on a line width difference resulting from the subtraction.

According to the present invention, the first portion of the film is exposed to only the zero-order light with the focus component being removed from the light of the light source, and the second portion is exposed to the zero-order light and the higher order light including the focus component of the light and the exposure amount component of the light source. The exposure and the development subsequent thereto reduce the film of the first portion and the film of the second portion, and the film thicknesses of the reduced portions are measured converted into line widths. The line width of the first portion results only from the exposure amount component, and the line width of the second portion results both from the exposure amount and focus components. By subtracting the line width of the second portion from the line width of the first portion, the line width resulting only from the focus component is obtained. The focus condition at the time of exposure is set again based on the line width difference, whereby more accurate setting can be performed. Further, since the measured film thicknesses are converted into the line widths based on the correlations between the film thicknesses and the line widths, it is possible to detect the line width using the film thickness measuring unit rather than using the CD-SEM as in the prior art. The use of the film thickness measuring unit enables accurate measurement without damage to the resist pattern and reduction in the time required for measurement.

Therefore, according to the present invention, the setting of the focus condition at the time of exposure in the photolithography process can be performed more accurately to improve the dimensional accuracy and the uniformity of the line width of the resist pattern within the substrate.

The method may further includes the step of calculating a reduction in film thickness of the first portion and a reduction in film thickness of the second portion from results of the measurement of the film thicknesses, wherein the calculated reduction in film thickness of the first portion and the calculated reduction in film thickness of the second portion may be converted into the line widths of the resist pattern by previously obtained correlations between the reductions in film thicknesses and the line widths in place of the correlations between the film thicknesses and the line widths.

According to another aspect, the present invention is a method of setting a focus condition at the time of exposure in a photolithography process of forming a resist pattern on a substrate, including the steps of: exposing a film on the substrate to light using a mask having a first pattern transmitting only zero-order light of a light source and then developing the film to reduce a first portion of the film on the substrate in the photolithography process in which a certain focus condition has been already set; exposing the film on the substrate to light using the mask having a second pattern transmitting zero-order light and higher order light of the light source and then developing the film to reduce a second portion of the film on the substrate in the photolithography process in which the certain focus condition has been already set; measuring film thicknesses of the first portion and the second portion; subtracting the film thickness of the second portion from the film thickness of the first portion to calculate a film thickness difference therebetween based on results of the measurement of the film thicknesses; converting the calculated film thickness difference into a line width of the resist pattern by a previously obtained correlation between the film thickness difference and the line width; and setting a new focus condition based on the converted line width.

According to the above, the first portion of the film is exposed to only the zero-order light with the focus component being removed from the light of the light source, and the second portion is exposed to the zero-order light and the higher order light including the focus component of the light and the exposure amount component of the light source. The exposure and the development subsequent thereto reduce the film of the first portion and the film of the second portion, and the film thicknesses of the reduced portions are measured. The film thickness of the first portion results only from the exposure amount component, and the film thickness of the second portion results both from the exposure amount and focus components. By subtracting the film thickness of the second portion from the film thickness of the first portion, the film thickness resulting only from the focus component is obtained. Then, the film thickness difference therebetween is converted into a line width, and the focus condition at the time of exposure is set based on the line width, whereby more accurate setting can be performed. Further, since the film thickness is converted into the line width based on the correlation between the film thickness difference and the line width, it is possible to detect the line width using the film thickness measuring unit rather than using the CD-SEM as in the prior art. The use of the film thickness measuring unit enables accurate measurement without damage to the resist pattern and reduction in the time required for measurement.

A reduction in film thickness of the first portion and a reduction in film thickness of the second portion may be calculated based on the results of the measurement of the film thicknesses, and the film thickness difference between the first portion and the second portion may be calculated from the reduction in film thickness of the first portion and the reduction in film thickness of the second portion.

The first pattern may be formed with a region transmitting the zero-order light of the light source and a region not transmitting the light of the light source, the second pattern may be formed with a region transmitting the zero-order light and the higher order light of the light source and a region not transmitting the light of the light source, the reduction in film thickness of the first portion may be obtained by calculating a film thickness difference between portions in the first portion of the film corresponding to the two regions of the first pattern, and the reduction in film thickness of the second portion may be obtained by calculating a film thickness difference between portions in the second portion of the film corresponding to the two regions of the second pattern.

The first pattern may be formed with a plurality of regions which transmit the zero-order light and are different in transmittance, and the second pattern may be formed with a plurality of regions which transmit the zero-order light and the higher order light and are different in transmittance.

According to still another aspect, the present invention is an apparatus for setting a focus condition at the time of exposure in a photolithography process of forming a resist pattern on a substrate, including: a mask for exposure having a first pattern transmitting only zero-order light of a light source and a second pattern transmitting zero-order light and higher order light of the light source; a film thickness measuring unit for measuring a film thickness when a film on the substrate is exposed to only the zero-order light of the light source transmitted through the mask and then developed to reduce a first portion of the film on the substrate in the photolithography process in which a certain focus condition has been already set, and a film thickness when the film on the substrate is exposed to the zero-order light and the higher order light of the light source transmitted through the mask and then developed to reduce a second portion of the film on the substrate in the photolithography process in which the certain focus condition has been already set; and a setting unit for converting the measured film thickness of the first portion and the measured film thickness of the second portion into line widths of the resist pattern by previously obtained correlations between the film thicknesses and the line widths, subtracting the converted line width of the second portion from the converted line width of the first portion, and setting a new focus condition based on a line width difference resulting from the subtraction.

The setting unit may calculate a reduction in film thickness of the first portion and a reduction in film thickness of the second portion from results of the measurement of the film thicknesses, and convert the calculated reduction in film thickness of the first portion and the calculated reduction in film thickness of the second portion into line widths of the resist pattern by previously obtained correlations between the reductions in film thicknesses and the line widths.

According to yet another aspect, the present invention is an apparatus for setting a focus condition at the time of exposure in a photolithography process of forming a resist pattern on a substrate, including: a mask for exposure having a first pattern transmitting only zero-order light of a light source and a second pattern transmitting zero-order light and higher order light of the light source; a film thickness measuring unit for measuring a film thickness when a film on the substrate is exposed to only the zero-order light of the light source transmitted through the mask and then developed to reduce a first portion of the film on the substrate in the photolithography process in which a certain focus condition has been already set, and a film thickness when the film on the substrate is exposed to the zero-order light and the higher order light of the light source transmitted through the mask and then developed to reduce a second portion of the film on the substrate in the photolithography process in which the certain focus condition has been already set; and a setting unit for subtracting the film thickness of the second portion from the film thickness of the first portion to calculate a film thickness difference therebetween based on results of the measurement of the film thicknesses, converting the calculated film thickness difference into a line width of the resist pattern by a previously obtained correlation between the film thickness difference and the line width, and setting a new focus condition based on the converted line width.

The setting unit may calculate a reduction in film thickness of the first portion and a reduction in film thickness of the second portion from the results of the measurement of the film thicknesses, and calculate the film thickness difference between the first portion and the second portion from the reduction in film thickness of the first portion and the reduction in film thickness of the second portion.

The first pattern may be formed with a region transmitting the zero-order light of the light source and a region not transmitting the light of the light source, the second pattern may be formed with a region transmitting the zero-order light and the higher order light of the light source and a region not transmitting the light of the light source, and the setting unit may calculate a film thickness difference between portions in the first portion of the film corresponding to the two regions of the first pattern to obtain the reduction in film thickness of the first portion, and calculate a film thickness difference between portions in the second portion of the film corresponding to the two regions of the second pattern to obtain the reduction in film thickness of the second portion.

The first pattern may be formed with a plurality of regions which transmit the zero-order light and are different in transmittance, and the second pattern may be formed with a plurality of regions which transmit the zero-order light and the higher order light and are different in transmittance.

According to another aspect, the present invention is a computer program product for causing a computer to realize a function of a setting unit in an apparatus for setting a focus condition at the time of exposure in a photolithography process of forming a resist pattern on a substrate. The setting apparatus includes: a mask for exposure having a first pattern transmitting only zero-order light of a light source and a second pattern transmitting zero-order light and higher order light of the light source; a film thickness measuring unit for measuring a film thickness when a film on the substrate is exposed to only the zero-order light of the light source transmitted through the mask and then developed to reduce a first portion of the film on the substrate in the photolithography process in which a certain focus condition has been already set, and a film thickness when the film on the substrate is exposed to the zero-order light and the higher order light of the light source transmitted through the mask and then developed to reduce a second portion of the film on the substrate in the photolithography process in which the certain focus condition has been already set; and the setting unit. The computer program product includes: computer readable program code means for causing the computer to convert the measured film thickness of the first portion and the measured film thickness of the second portion into line widths of the resist pattern by previously obtained correlations between the film thicknesses and the line widths, subtracting the converted line width of the second portion from the converted line width of the first portion, and setting a new focus condition based on a line width difference resulting from the subtraction, in the setting unit.

Such a computer program product is recorded for example, on a computer readable recording medium, such as a hard disk, a compact disk, a magneto-optical disk, a flexible disk or the like.

DETAILED DESCRIPTION OF THE INVENTION

Figure 1:
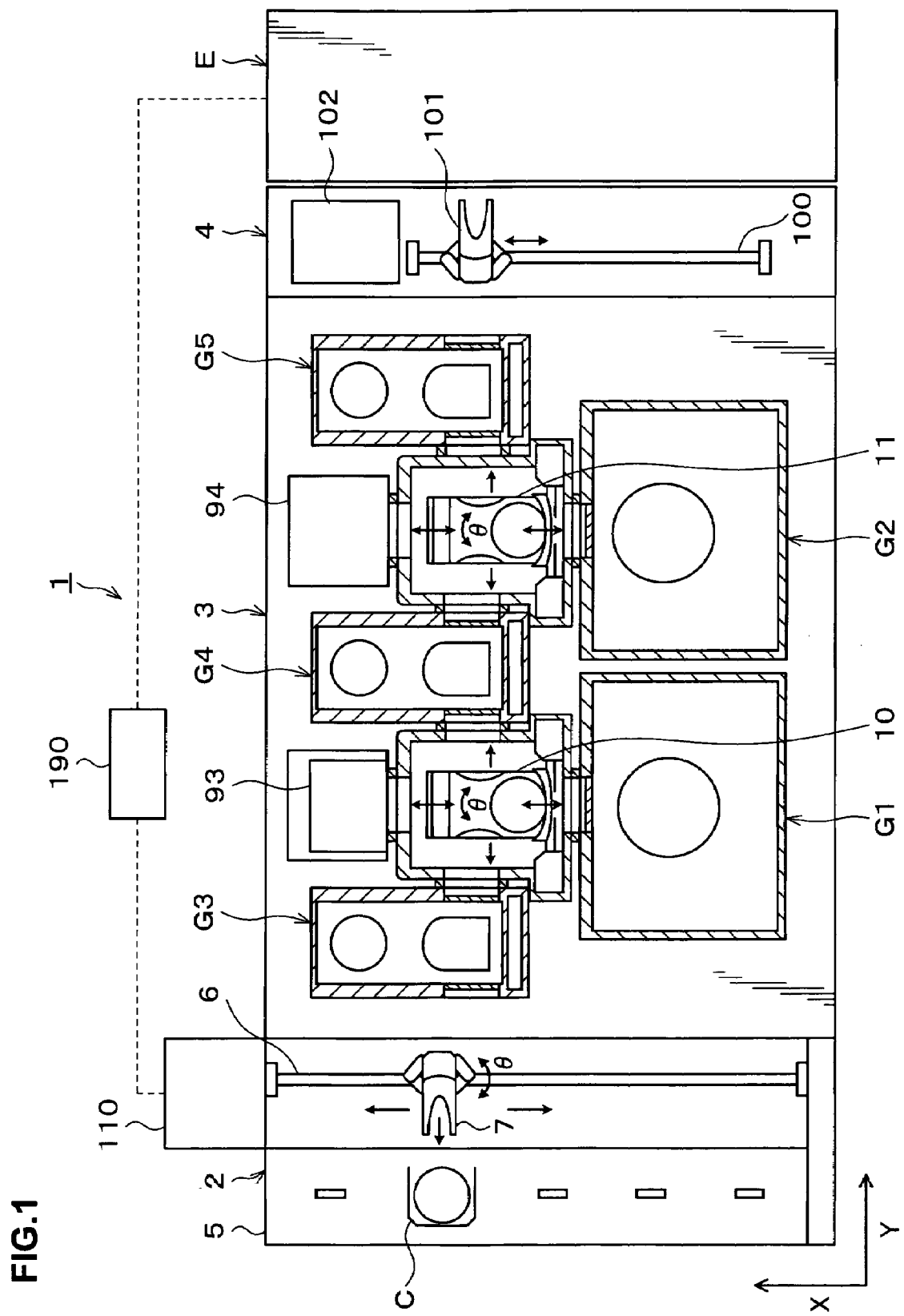
FIG. 1 is a plan view showing a configuration of a coating and developing treatment system.
Figure 2:
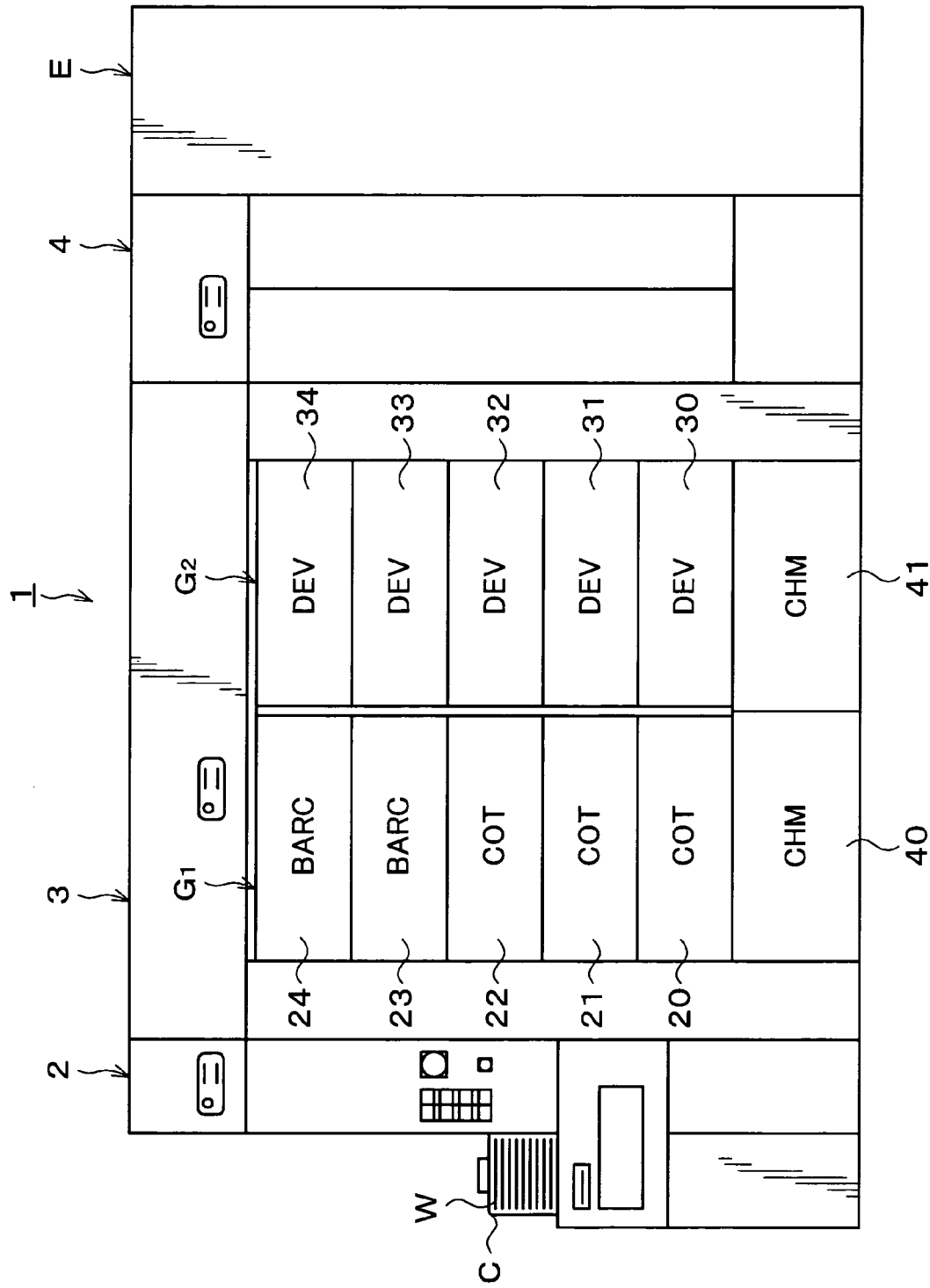
FIG. 2 is a front view of the coating and developing treatment system in FIG. 1.
Figure 3:
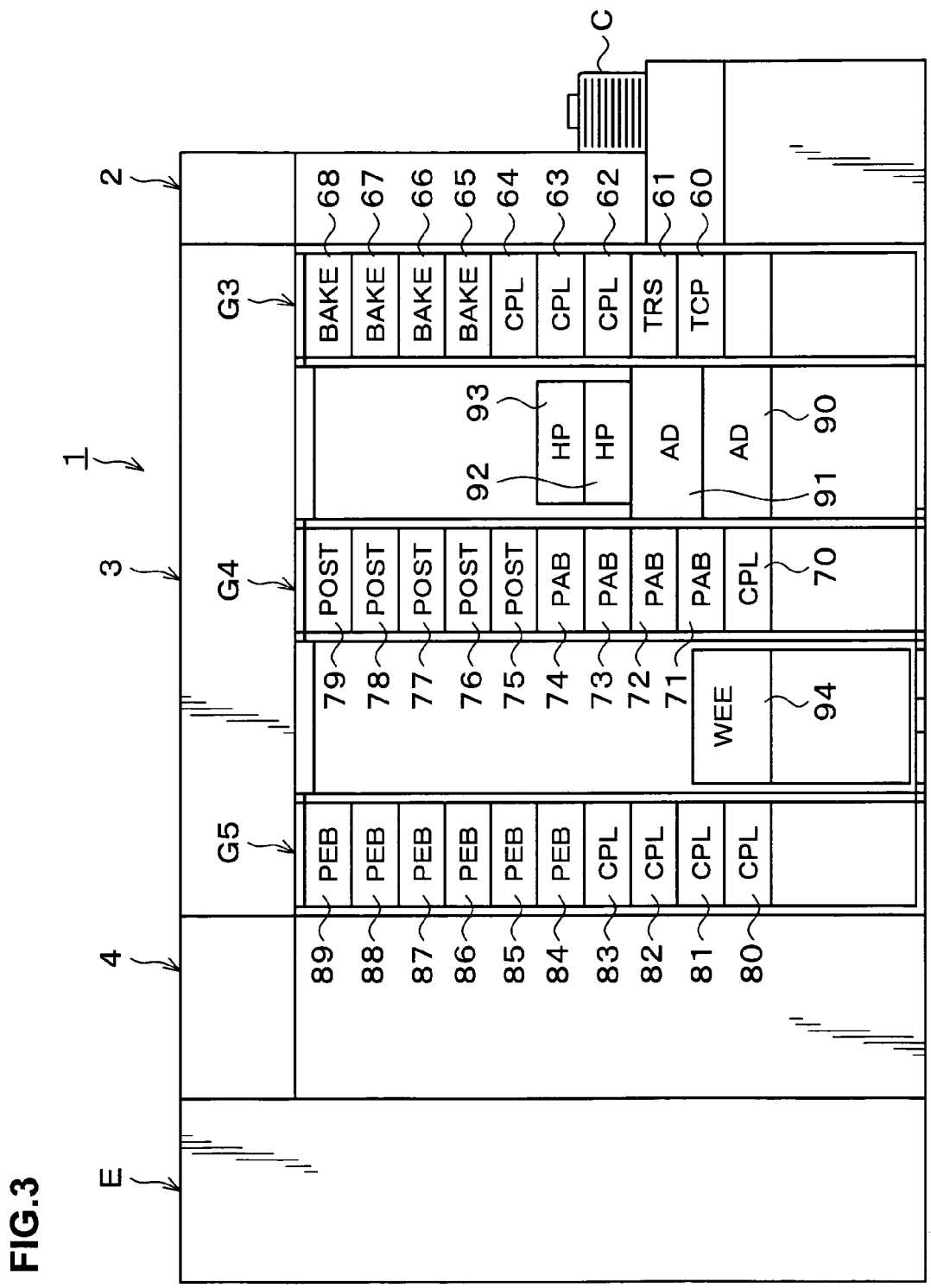
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 in which an apparatus for setting a focus condition at the time of exposure according to the embodiment is applied, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers W per cassette as a unit from/to the outside into/from the coating and developing treatment system 1 and carrying the wafers W into/out of a cassette C; a processing station 3 including a plurality of various kinds of processing and treatment units, which are multi-tiered, for performing predetermined processing or treatments in a manner of single wafer processing in the photolithography process; and an interface section 4 for transferring the wafers W to/from an aligner E provided adjacent to the processing station 3, are integrally connected together.

In the cassette station 2, a cassette mounting table 5 is provided and configured such that a plurality of cassettes C can be mounted on the cassette mounting table 5 in a line in an X-direction (a top-to-bottom direction in FIG. 1). In the cassette station 2, a wafer carrier 7 is provided which is movable in the X-direction on a carrier path 6. The wafer carrier 7 is also movable in a wafer-arrangement direction of the wafers W housed in the cassette C (a Z-direction; the vertical direction), and thus can selectively access the wafers W in each of the cassettes C arranged in the X-direction.

The wafer carrier 7, which is rotatable in a θ-direction around the Z-axis, can access a later-described temperature regulating unit 60 and a transition unit 61 included in a third processing unit group G3 on the processing station 3 side.

To the cassette station 2, for example, on the rear side, a film thickness measuring unit 110 is adjacently connected as a later-described film thickness measuring unit. The wafer carrier 7 can carry the wafer W also to the film thickness measuring unit 110.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first carrier unit 10 is provided. The first carrier unit 10 can selectively access the processing and treatment units in the first processing unit group G1, the third processing unit group G3, and the fourth processing unit group G4 and carry the wafer W to them. Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for performing thermal processing for the wafer W, for example, high-precision temperature regulating units 80 to 83, and post-exposure baking units 84 to 89 each for heat-processing the wafer W after exposure, are ten-tiered in order from the bottom.

As shown in FIG. 1, a plurality of processing and treatment units are arranged on the positive direction side in the X-direction of the first carrier unit 10, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive direction side in the X-direction of the second carrier unit 11, for example, an edge exposure unit 94 is disposed which selectively exposes only the edge portion of the wafer W to light.

In the interface section 4, for example, a wafer carrier 101 moving on a carrier path 100 extending in the X-direction and a buffer cassette 102 are provided as shown in FIG. 1. The wafer carrier 101 is movable in the Z-direction and also rotatable in the θ-direction and thus can access the aligner E adjacent to the interface section 4, the buffer cassette 102, and the processing and treatment units in the processing unit group G5 and carry the wafer W to them.

Figure 4:
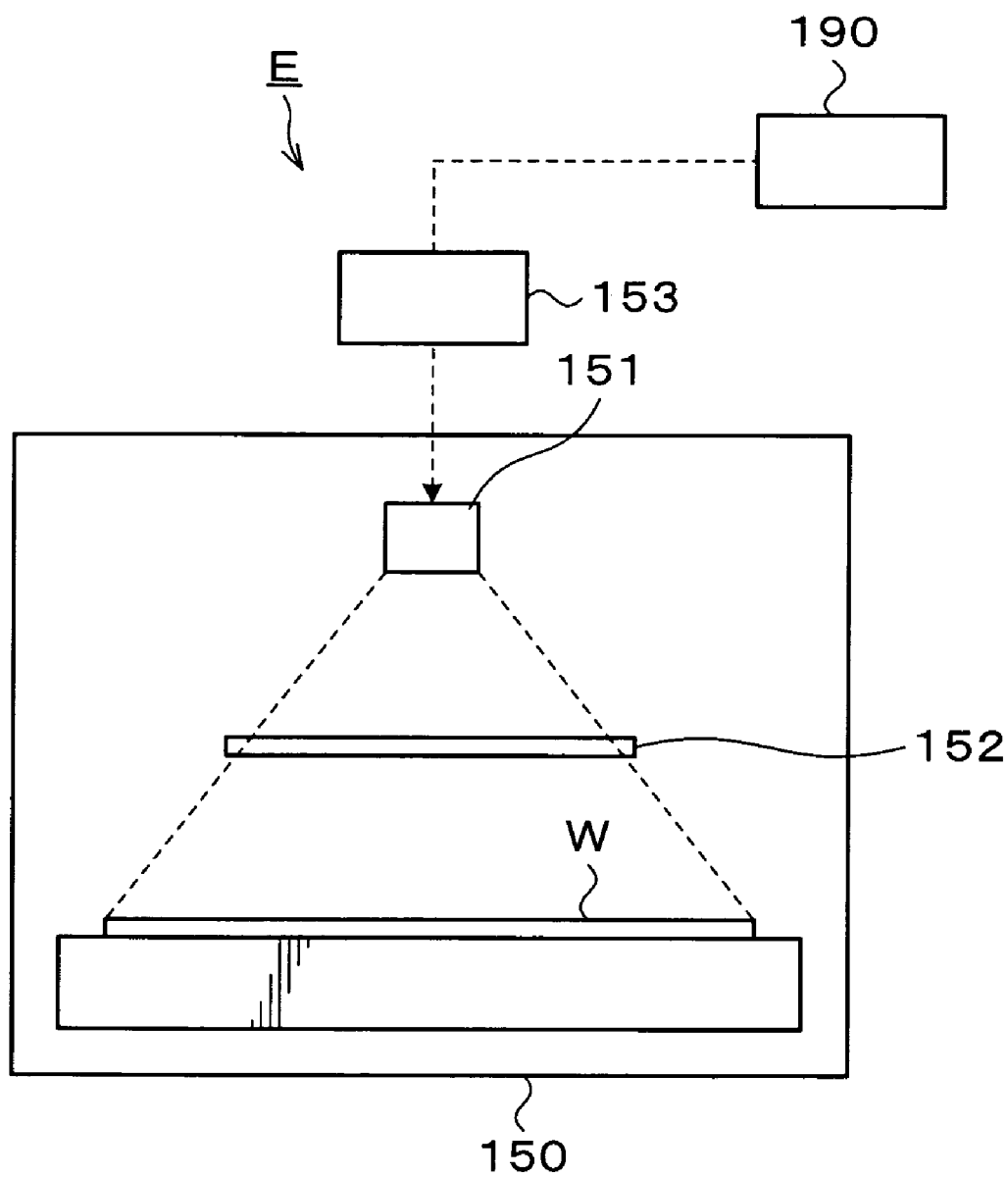
FIG. 4 is a schematic view showing the outline of a configuration of an aligner.
Figure 5:
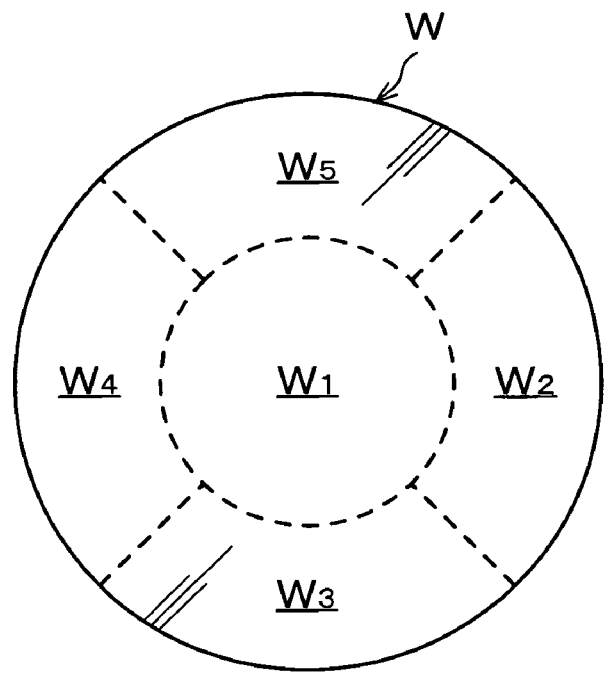
FIG. 5 is a plan view of a wafer divided into a plurality of wafer regions.

The aligner E includes, as shown in FIG. 4, for example, a mounting table 150 on which the wafer W is mounted at a predetermined position, a light source 151 for applying light to the wafer W mounted on the mounting table 150, and a mask 152 with a predetermined pattern laid out. The mask 152 is arranged between the mounting table 150 and the light source 151. The aligner E can apply light from the light source 151 through the mask 152 to the wafer W on the mounting table 150 to thereby expose the resist film on the wafer W in the predetermined pattern. The application of light of the light source 151 is controlled by an exposure controller 153 in which exposure conditions are set such as the exposure amount (dose of light), focus, and so on. The exposure controller 153 can adjust the exposure conditions, for example, for each of a plurality of regions within the wafer. For example, the exposure controller 153 can adjust the exposure conditions for each of a circular wafer region $W_1$ located at the center portion as seen from above and wafer regions $W_2$, $W_3$, $W_4$, and $W_5$ made by equally dividing the peripheral portion of the wafer region $W_1$ into four sectors as shown in FIG. 5. The setting of the exposure conditions in the exposure controller 153 can be performed, for example, by a later-described exposure condition setting unit 190.

Figure 6:
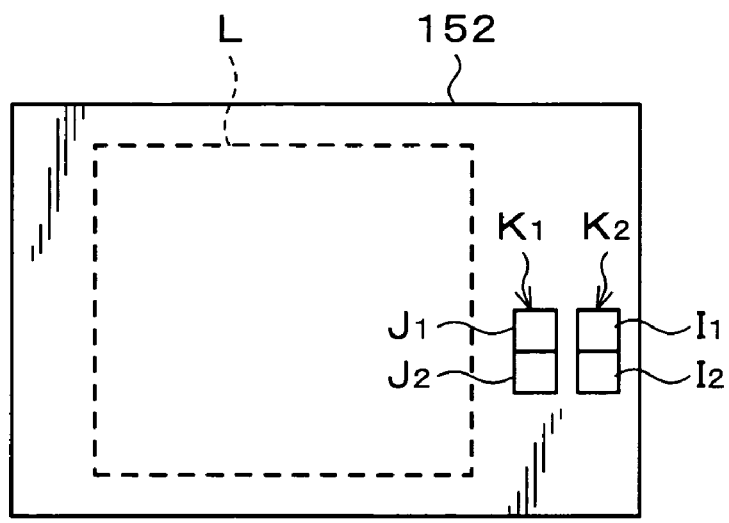
FIG. 6 is a plan view of a mask.

The mask 152 in the aligner E is formed with, for example, a pattern L for products and two patterns K1 and K2 for measuring the film thickness as shown in FIG. 6. The first pattern K1 is composed of, for example, two regions J1 and J2. The second pattern K2 is composed of, for example, two regions I1 and I2.

Figures 7, 8:
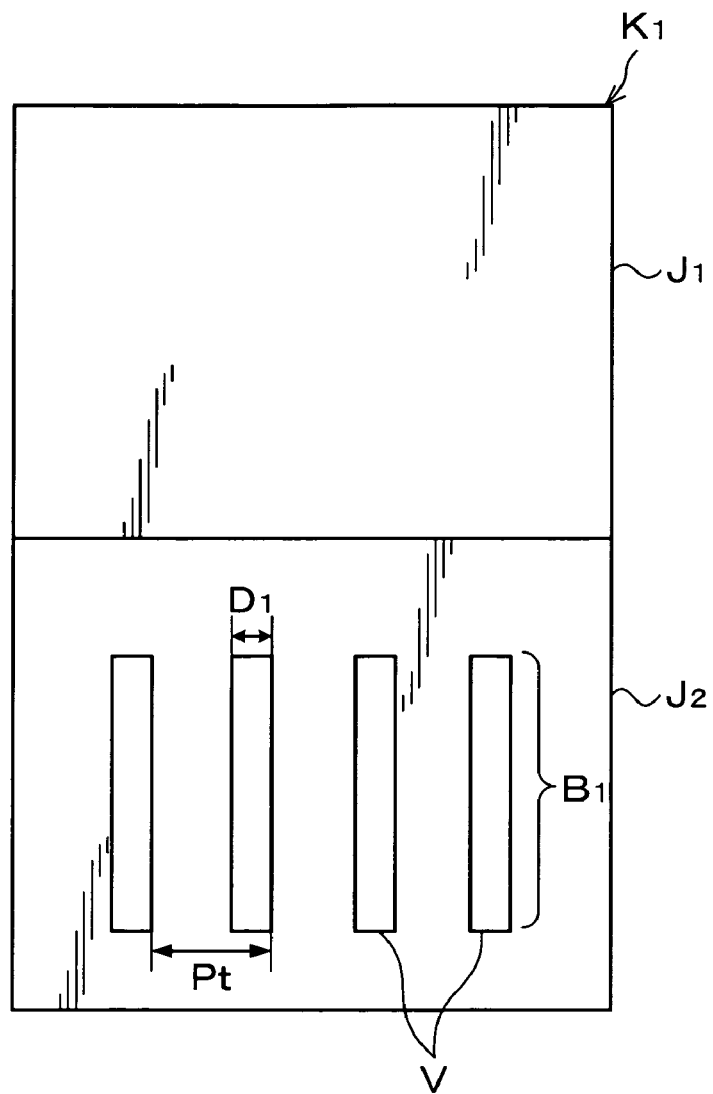
FIG. 7 is a plan view of a first pattern in the mask.
FIG. 8 is a conditional expression met by a pitch between slits in the first pattern.

As shown in FIG. 7, the first region J1 of the first pattern K1 is formed such that the transmittance is, for example, 0%, that is, light is blocked.

The second region J2 of the first pattern K1 is formed with a pattern B1 which transmits only zero-order light of the light from the light source 151 and reduces the light amount through the whole second region J2 to a predetermined transmittance, for example, 10%. This pattern B1 is formed, for example, on a line-and-space basis, such that a plurality of rectangular slits V of the same shape are arranged side by side at regular intervals. The slits V are formed such that a pitch Pt between the slits V in the pattern B1 meets a conditional expression (1) in FIG. 8. In the conditional expression (1), NA represents the number of openings, σ represents the coherence factor, and λ represents the wavelength of light. This removes high order light, that is, ± first-order light and higher from the light transmitted through the second region J2, leaving only the zero-order light, so that the transmitted light includes no focus component of light caused by interference of the zero-order light and the higher order light but includes only the component of exposure amount by the zero-order light. With a width D1 of a shorter side of the slit V in the pattern B1, the transmittance is adjusted to be 10% in the second region J2.

Figure 9:
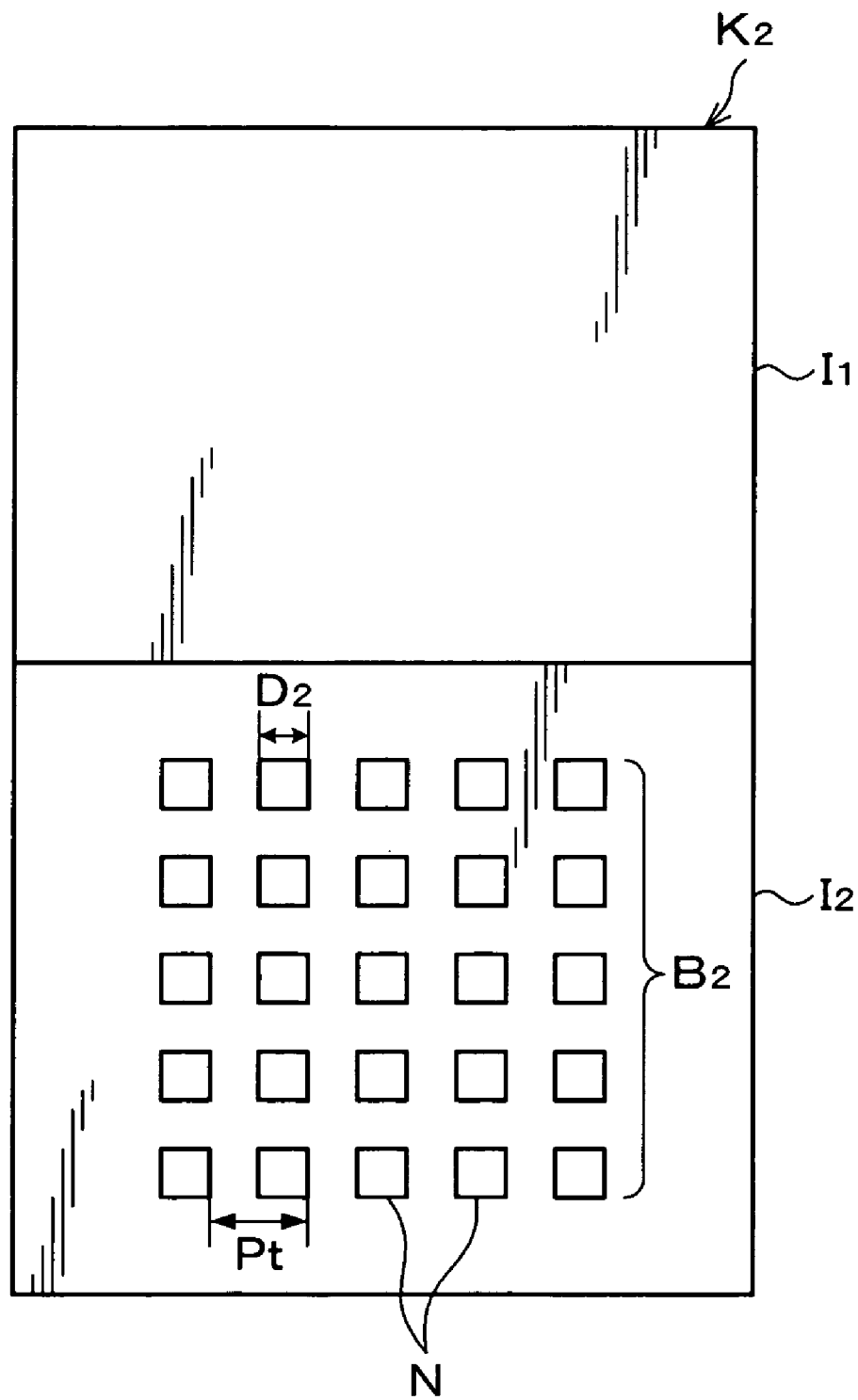
FIG. 9 is a plan view of a second pattern in the mask.

As shown in FIG. 9, the first region I1 of the second pattern K2 is formed such that the transmittance is, for example, 0%, that is, light is blocked.

The second region I2 of the second pattern K2 is formed with a pattern B2 which transmits zero-order light and ±first-order light and higher of the light from the light source 151 and reduces the light amount through the whole second region I2 to a predetermined transmittance, for example, 10%. In this pattern B2, for example, many square holes N are vertically and horizontally arranged at regular intervals. The pattern B2 is formed such that a pitch Pt between the holes N does not meet the conditional expression (1) in FIG. 8. This allows both the zero-order light and the higher order light of the light source 151 to be transmitted through the second pattern K2, so that the transmitted light includes both the focus component of light and the component of exposure amount. The transmittance of the second region I2 is adjusted by a diameter D2 of the hole N in the pattern B2.

Figure 10:
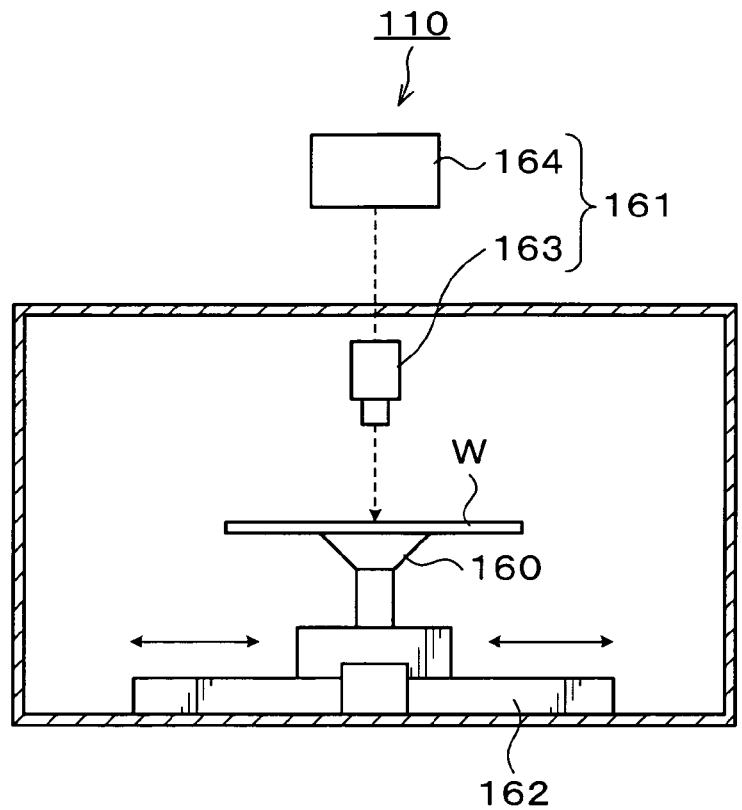
FIG. 10 is a longitudinal sectional view showing the outline of a configuration of a film thickness measuring unit.

The film thickness measuring unit 110 includes, for example, a chuck 160 for horizontally holding the wafer W and a light interference type film thickness gauge 161 as shown in FIG. 10. The chuck 160 is placed on, for example, an X-Y stage 162 and is thus movable in horizontal directions in two dimensions. The light interference type film thickness gauge 161 includes, for example, a probe 163 for applying light to the wafer W and receiving its reflected light, and a measuring unit 164 for measuring the thickness of a film on the wafer W based on information on the light received by the probe 163. By moving the wafer W relative to the probe 163, the film thickness can be measured at a plurality of locations within the wafer, for example, the wafer regions $W_1$ to $W_5$ where the focus can be set.

Next, a configuration of the exposure condition setting unit 190 for setting conditions of the above-described aligner E will be described. The exposure condition setting unit 190 is composed of, for example, a general-purpose computer including a CPU, a memory, and so on, and is connected to the exposure controller 153 for the aligner E as shown in FIG. 4. Note that the exposure condition setting unit 190 in this embodiment has a function as a setting unit.

Figure 11:
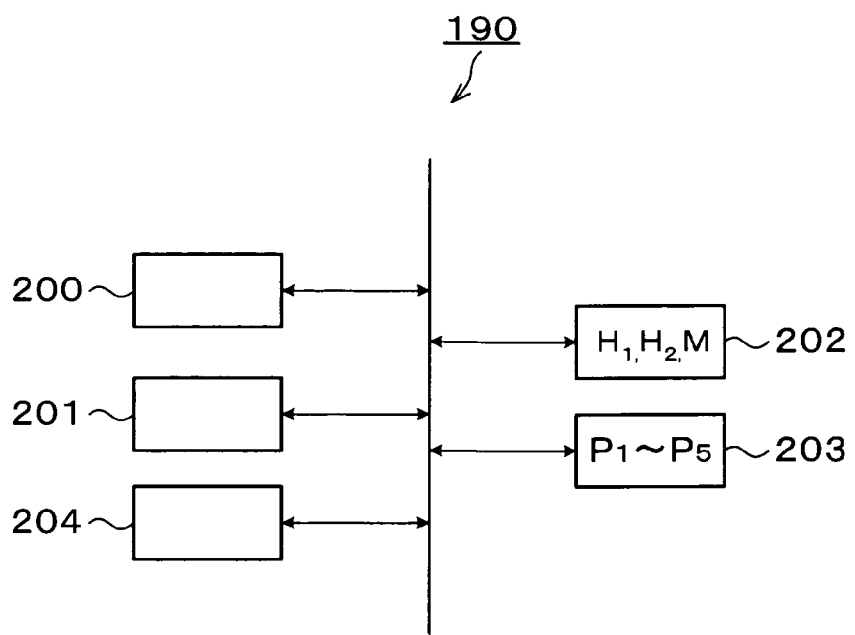
FIG. 11 is a block diagram showing a configuration of an exposure condition setting unit.

As shown in FIG. 11, the exposure condition setting unit 190 includes: for example, a calculation unit 200 composed of a CPU for executing various kinds of programs; an input unit 201 composed of, for example, a keyboard or the like for inputting various kinds of information; a data storage unit 202 composed of a memory for storing various kinds of information; a program storage unit 203 for storing various kinds of programs; and a communication unit 204 for communicating with the exposure controller 153 and the film thickness measuring unit 110.

Figure 12:
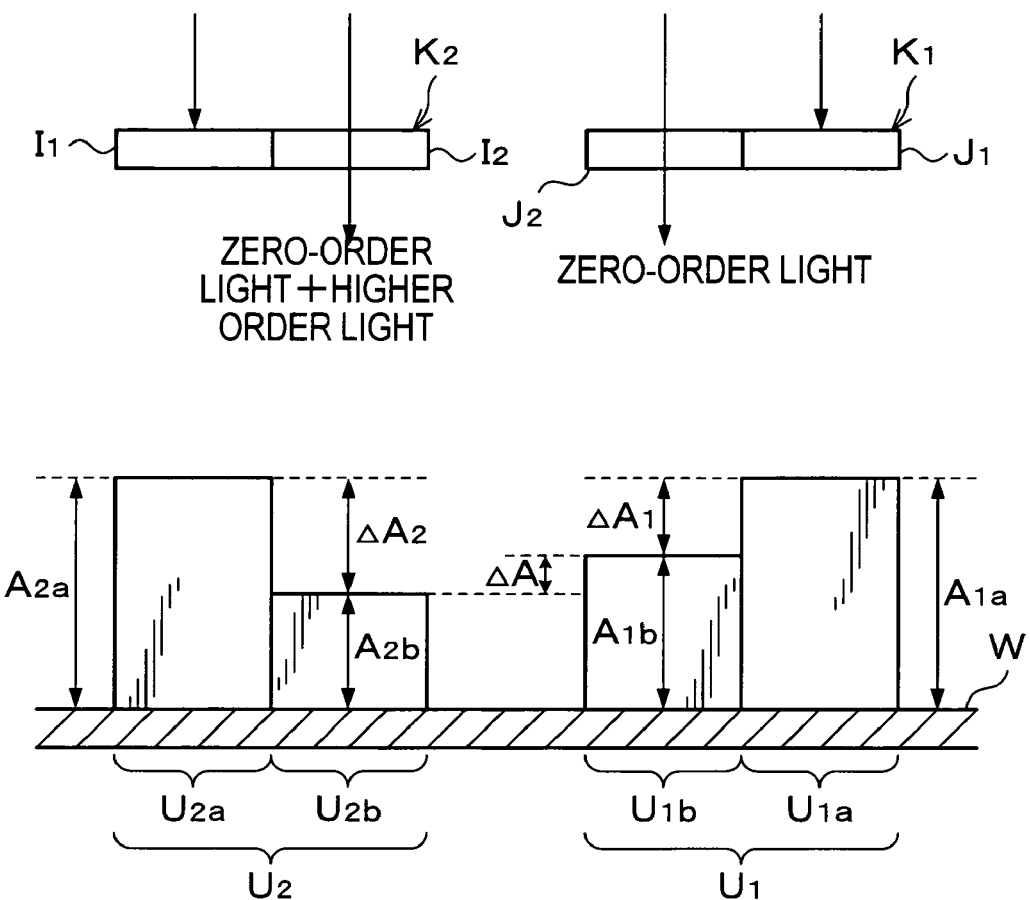
FIG. 12 is a schematic view showing film thicknesses of a first portion and a second portion of a resist film.

The program storage unit 203 stores, for example, a program P1 for calculating, based on the results of the film thickness measurement inputted from the film thickness measuring unit 110, a reduction in film thickness $\Delta A1$ of a first portion U1 of the resist film exposed to light through the first pattern K1 and a reduction in film thickness $\Delta A2$ of a second portion U2 of the resist film exposed to light through the second pattern K2 at the time of exposure as shown in FIG. 12.

The program P1 can obtain the reduction in film thickness $\Delta A1$ of the first portion U1 by calculating the film thickness difference between a film thickness A1a of a portion U1a corresponding to the first region J1 of the first pattern K1 and irradiated with no light and a film thickness A1b of a portion U1b exposed to the light transmitted through the second region J2 in the first portion U1. Furthermore, the program P1 can obtain the reduction in film thickness $\Delta A2$ of the second portion U2 by calculating the film thickness difference between a film thickness A2a of a portion U2a corresponding to the first region I1 of the second pattern K2 and irradiated with no light and a film thickness A2b of a portion U2b exposed to the light transmitted through the second region I2 in the second portion U2.

The program storage unit 203 stores a program P2 for converting the reduction in film thickness $\Delta A1$ of the first portion U1 and the reduction in film thickness $\Delta A2$ of the second portion U2 of the resist film into line widths by later-described correlation functions H1 and H2, respectively. The program storage unit 203 further stores a program P3 for subtracting the converted line width of the first portion U1 from the converted line width of the second portion U2 to calculate a line width difference therebetween, and a program P4 for calculating a focus correction value $\Delta F$ of the light source 151 of the aligner E using a later-described calculation model M based on the line width difference. The program storage unit 203 further stores a program P5 for changing the existing focus condition setting in the aligner E based on the calculated focus correction value $\Delta F$. It should be noted that these various kinds of programs for realizing the function of the exposure condition setting unit 190 may be installed by a computer readable recording medium.

Figures 13, 14:
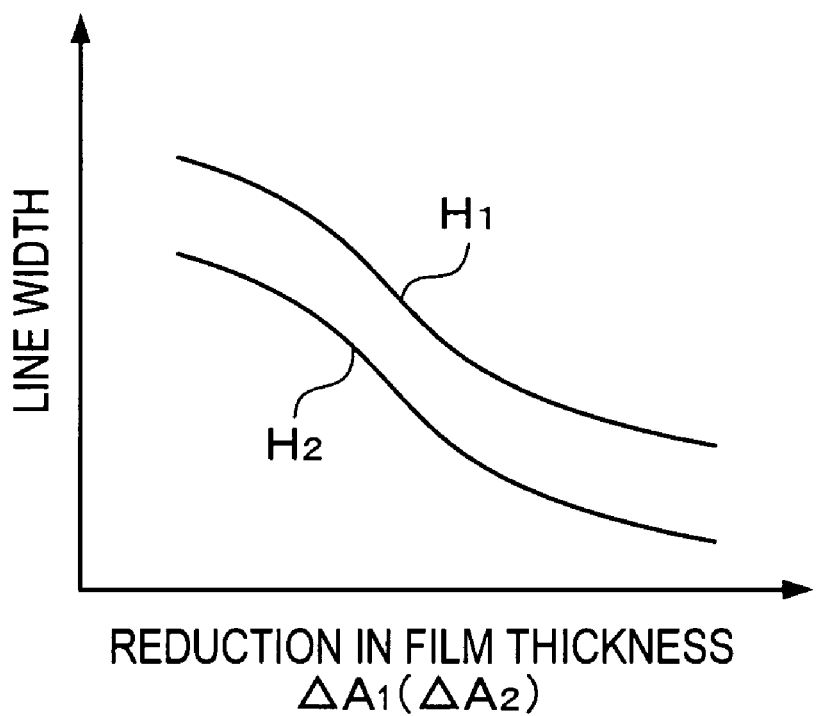
FIG. 13 is a graph showing the correlations between the reductions in film thicknesses and the line widths.
FIG. 14 is a relational expression between the variation in line width and the focus correction value using a calculation model.

The data storage unit 202 stores the correlation function H1 between the reduction in film thickness $\Delta A1$ and the line width and the correlation function H2 between the reduction in film thickness $\Delta A2$ and the line width, which have been previously obtained, as shown in FIG. 13. The correlation functions H1 and H2 are obtained, for example, by experiments which are previously performed.

The data storage unit 202 further stores, for example, the calculation model M. The calculation model M is a correlation model shown, for example, by a relational expression (2) between the variation in line width $\Delta CD$ of the resist pattern and the focus correction value $\Delta F$ as shown in FIG. 14. This calculation model M can calculate an optimum focus correction value $\Delta F$ for making the line widths uniform within the wafer W based on the line widths converted by the above-described correlation functions H1 and H2. The focus correction value AF can be obtained for each of the wafer regions $W_1$ to $W_5$ within the wafer.

In this embodiment, the apparatus for setting the focus condition at the time of exposure is composed of, for example, the mask 152, the film thickness measuring unit 110 and the exposure condition setting unit 190.

In the coating and developing treatment system 1 configured as described above, first of all, one unprocessed wafer W is taken out of the cassette C on the cassette mounting table 5 by the wafer carrier 7 shown in FIG. 1 and carried to the temperature regulating unit 60 included in the third processing unit group G3. The wafer W carried to the temperature regulating unit 60 is temperature-regulated to a predetermined temperature, and is then carried by the first carrier unit 10 into the bottom coating unit 23 where the wafer W is formed with an anti-reflection film. The wafer W formed with the anti-reflection film is sequentially carried by the first carrier unit 10 to the heating unit 92, the high-temperature thermal processing unit 65, and the high-precision temperature regulating unit 70 so that predetermined processing is performed in each of the units. Thereafter, the wafer W is carried to the resist coating unit 20 where a resist film is formed on the wafer W. The wafer W is then carried by the first carrier unit 10 to the pre-baking unit 71 where the wafer W is subjected to pre-baking. The wafer W is subsequently carried by the second carrier unit 11 to the edge exposure unit 94 and the high-precision temperature regulating unit 83 in sequence so that the wafer W is subjected to predetermined processing in each of the units. Thereafter, the wafer W is carried by the wafer carrier 101 in the interface section 4 to the aligner E where the wafer is exposed to light in a predetermined pattern.

The wafer W for which exposure processing has been finished is carried by the wafer carrier 101 to the PEB unit 84 where the wafer W is subjected to post-exposure baking. The wafer W for which the post-exposure baking has been finished is carried by the second carrier unit 11 to the high-precision temperature regulating unit 81 where the wafer W is temperature-regulated. The wafer W is then carried to the developing treatment unit 30 where the resist film on the wafer W is developed. The wafer W is then carried by the second carrier unit 11 to the post-baking unit 75 where the wafer W is subjected to heat-processing, and is then carried to the high-precision temperature regulating unit 63 where the wafer W is temperature-regulated. The wafer W is then carried by the first carrier unit 10 to the transition unit 61 and returned to the cassette C, thus completing a series of steps within the photolithography process.

Figure 15:
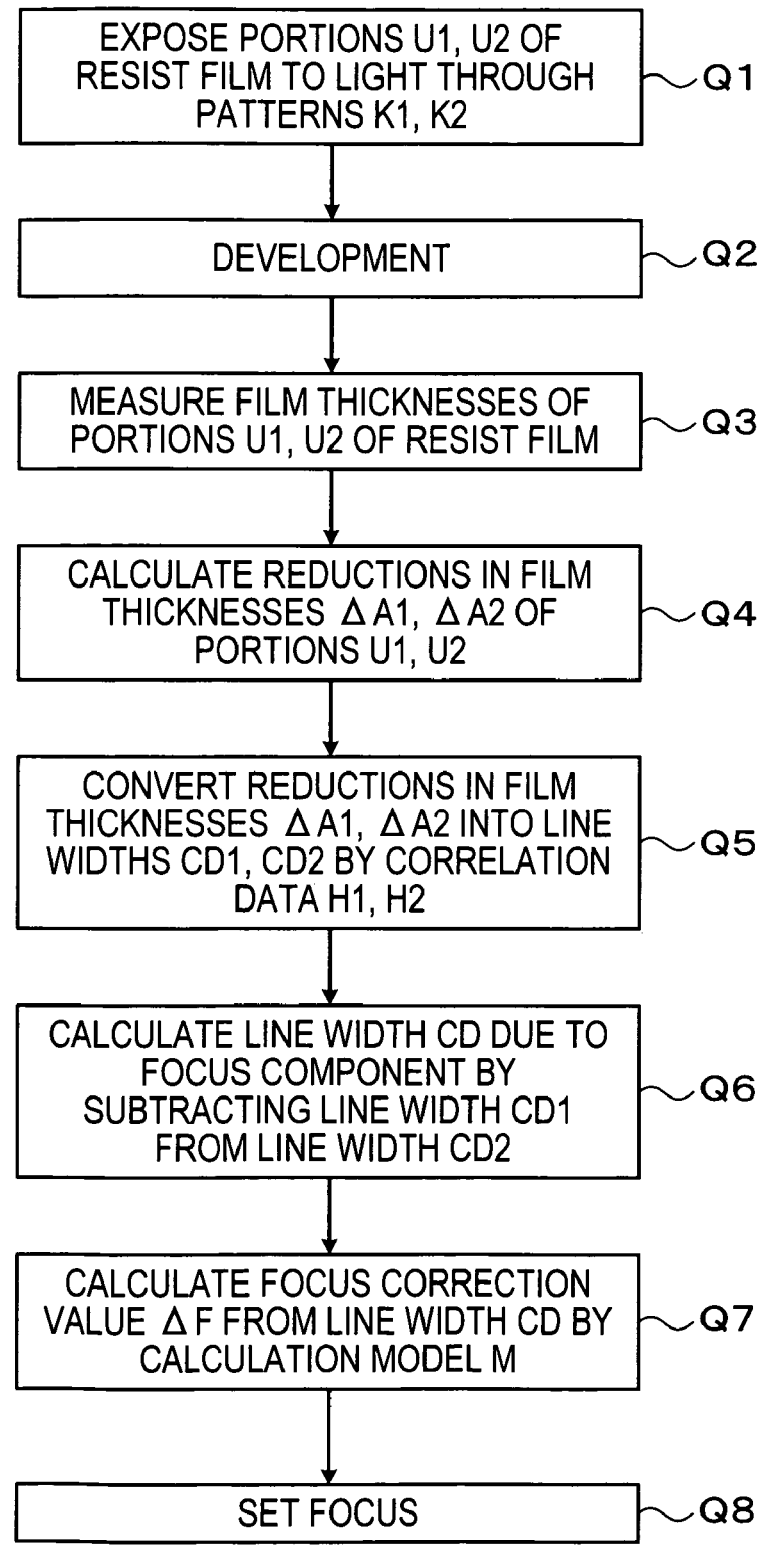
FIG. 15 is a flowchart of a setting process of a focus condition.

Next, a setting process of the focus condition in the aligner E will be described. FIG. 15 is a flowchart of the focus condition setting process.

First of all, under the existing processing condition setting, one wafer W is processed following the above-described photolithography process in the coating and developing treatment system 1. In this event, in the exposure processing in the aligner E, the first portion U1 of the resist film on the wafer W is exposed to light through the first pattern K1 in the mask 152 and the second portion U2 of the resist film is exposed to light through the second pattern K2 in the mask 152 as shown in FIG. 12 (step Q1 in FIG. 15).

The portion U1b in the first portion U1 of the resist film is exposed to light that is only the zero-order light of the light of the light source 151 reduced to 10% by the second region J2 of the first pattern K1. The portion U1a in the first portion U1 is exposed to no light since the light is blocked by the first region J1. The portion U2b in the second portion U2 is exposed to light that is the zero-order light and higher order light, of the light of the light source 151, both reduced to 10% by the second region I2 of the second pattern K2. The portion U2a in the second portion U2 is exposed to no light since the light is blocked by the first region I1.

Note that the exposure using the first pattern K1 and the second pattern K2 is performed a plurality of times, once for each of the wafer regions $W_1$ to $W_5$ where the focus setting is performed.

The wafer W for which exposure processing has been finished is sequentially subjected to post-exposure baking and developing treatment following the above-described photolithography process, whereby the exposed portions in the portions U1 and U2 of the resist film are dissolved in accordance with their exposure amounts (step Q2 in FIG. 15).

The wafer W for which a series of steps within the photolithography process has been finished is carried, for example, by the wafer carrier 7 to the film thickness measuring unit 110. In the film thickness measuring unit 110, the film thickness A1a of the portion U1a and the film thickness A1b of the portion U1b in the first portion U1 of the resist film are measured. Moreover, the film thickness A2a of the portion U2a and the film thickness A2b of the portion U2b in the second portion U2 are measured (step Q3 in FIG. 15). The results of the film thickness measurement are inputted, for example, into the exposure condition setting unit 190.

Figure 16:
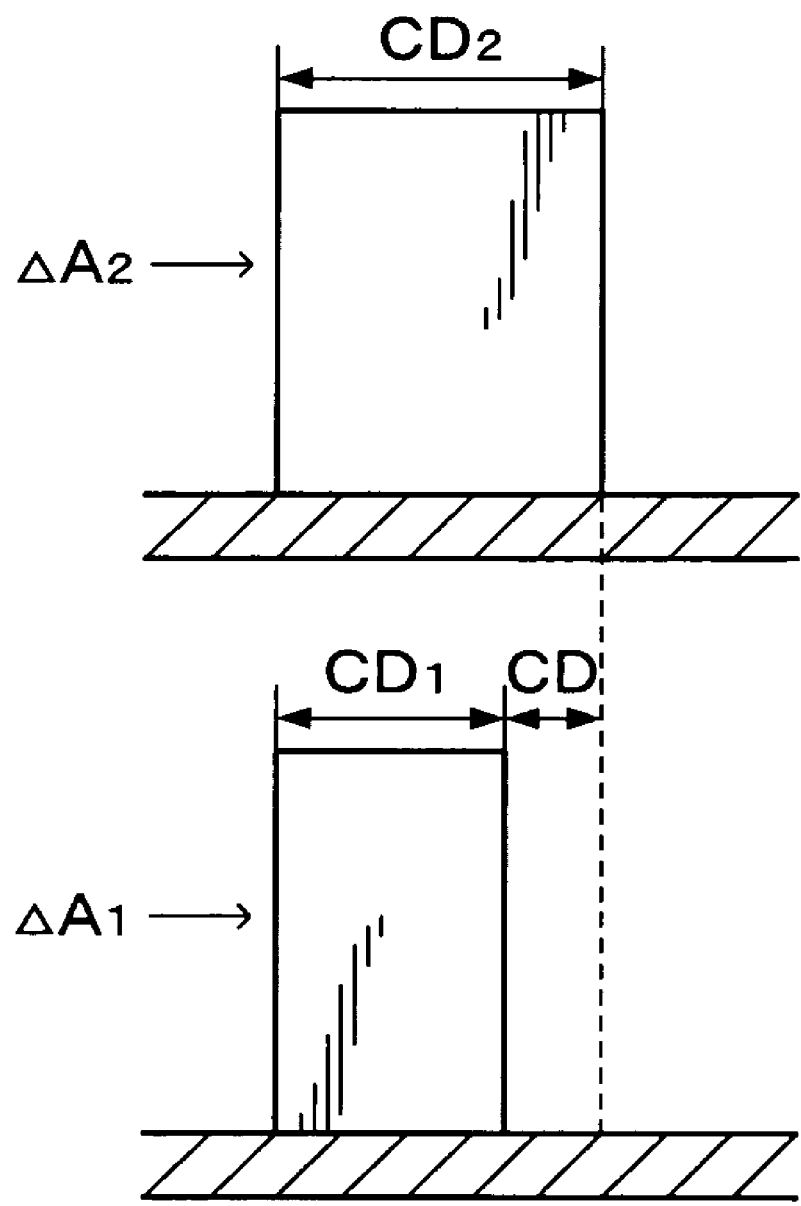
FIG. 16 is a schematic view for explaining a converted line width.

In the exposure condition setting unit 190, the film thickness difference between the film thickness A1a and the film thickness A1b is calculated from the inputted result of the film thickness measurement of the first portion U1 to obtain the reduction in film thickness ΔA1 in the first portion U1. Moreover, the film thickness difference between the film thickness A2a and the film thickness A2b is calculated from the inputted result of the film thickness measurement of the second portion U2 to obtain the reduction in film thickness ΔA2 in the second portion U2 (step Q4 in FIG. 15). Thereafter, the reduction in film thickness ΔA1 in the first portion U1 is converted into a line width CD1 by the correlation function H1 as shown in FIG. 16. Further, the reduction in film thickness ΔA2 in the second portion U2 is converted into a line width CD2 by the correlation function H2 (step Q5 in FIG. 15).

The line width CD1 is created by the exposure only to the zero-order light, and therefore is a line width component depending only on the component of exposure amount at the time of exposure. The line width CD2 is created by the exposure to the zero-order light and the higher order light, and therefore is a line width component depending both on the component of exposure amount at the time of exposure and on the focus component. The line width CD depending only on the focus component is calculated by subtracting the converted line width CD1 from the converted line width CD2 (step Q6 in FIG. 15). The line width CD is obtained for each of the wafer regions $W_1$ to $W_5$ respectively.

Subsequently, based on the calculated line width CD, the calculation model M calculates the focus correction value ΔF which makes the line widths uniform within the wafer (step Q7 in FIG. 15). For example, the difference between a common target line width and the line width CD within each of the wafer regions $W_1$ to $W_5$ is substituted as ΔCD into the left side of the relational expression (2) in FIG. 14, and each side is multiplied by the inverse matrix of the calculation model M. This calculates the focus correction value ΔF for each of the wafer regions $W_1$ to $W_5$.

Upon calculation of each of the focus correction values ΔF, that information is inputted from the communication unit 204 into the exposure controller 153. The focus correction value for the light source 151 in the aligner E is changed, and a new focus condition is set (step Q8 in FIG. 15). In this manner, the focus condition setting process at the time of exposure processing is completed.

According to the above-described embodiment, exposure is performed using the mask 152 formed with the first pattern K1 and the second pattern K2, the film thickness of the resist film which is reduced by the subsequent development is measured, and the line width is calculated from that film thickness using the correlation function H. As described above, it is unnecessary to use the conventional CD-SEM to measure the line width for the focus setting, thus ensuring that the line width can be specified with accuracy and in a short time without damage to the resist pattern on the wafer W.

Moreover, according to the above embodiment, the reduction in film thickness ΔA1 of the first portion U1 exposed only to the zero-order light of the light source 151 and the reduction in film thickness ΔA2 of the second portion U2 exposed to the zero-order light and the higher order light are calculated, and the reductions in film thicknesses ΔA1 and ΔA2 are converted into the line widths CD1 and CD2, respectively. The difference between the line widths CD2 and CD1 is obtained, whereby the line width CD resulting only from the focus component is calculated. Based on the line width CD, the focus correction value ΔF is then calculated, so that the focus setting is performed. In this manner, the focus setting is performed based on the line width CD depending only on the focus component, thus enabling more accurate setting.

Further, the first pattern K1 and the second pattern K2 reduce the light of the light source 151, thereby ensuring that the resist film remains more surely to allow appropriate measurement of the film thickness in each of the portions U1 and U2 of the resist film.

The film thickness difference between the portion irradiated with light and the portion irradiated with no light is calculated in each of the first portion U1 and the second portion U2 of the resist film, and the film thickness differences are regarded as reductions in film thicknesses $\Delta A1$ and $\Delta A2$, so that an error in the film thickness measurement due to, for example, a base film is canceled, thus ensuring that the reductions in film thickness is calculated with higher accuracy.

Although the reduction in film thickness $\Delta A1$ and the reduction in film thickness $\Delta A2$ are converted into the line widths CD1 and CD2, and then the line width CD1 is subtracted from the line width CD2 to obtain the line width CD depending only on the focus component in the above embodiment, the film thickness difference depending on the focus component may be calculated by subtracting the reduction in film thickness $\Delta A1$ from the reduction in film thickness $\Delta A2$ before conversion into the line widths, and the film thickness difference may be converted into the line width CD. In this case, for example, the reduction in film thickness $\Delta A1$ of the first portion U1 and the reduction in film thickness $\Delta A2$ of the second portion U2 are calculated, and thereafter the reduction in film thickness $\Delta A1$ is subtracted from the reduction in film thickness $\Delta A2$ to obtain a film thickness difference $\Delta A$ shown in FIG. 12. The film thickness difference $\Delta A$ is a result by subtracting the reduction in film thickness $\Delta A1$ depending only on the component of exposure amount at the time of exposure from the reduction in film thickness $\Delta A2$ depending both on the component of exposure amount at the time of exposure and on the focus component, resulting in the film thickness difference $\Delta A$ depending only on the focus component.

Upon calculation of the film thickness difference $\Delta A$, the film thickness difference $\Delta A$ is converted into the line width CD by a previously obtained correlation function between the film thickness difference and the line width. Thereafter, as in the above-described embodiment, the calculation model M calculates the focus correction value $\Delta F$ from the line width CD so that the focus setting is performed using the focus correction value $\Delta F$.

Also in this example, the focus setting is performed based on the film thickness difference $\Delta A$ depending only on the focus component, thus enabling more accurate setting. It should be noted that programs for calculating the film thickness difference $\Delta A$ and the line width CD may be stored in the program storage unit 203 of the exposure condition setting unit 190, and the correlation function between the film thickness difference and the line width may be stored in the data storage unit 202 in this example.

Although the first pattern K1 in the mask 152 is formed with the second region J2 with a transmittance of 10% in the above embodiment, it may be formed with a plurality of regions which transmit only the zero-order light and are different in transmittance from each other. Further, the second pattern K2 in the mask 152 may be formed with a plurality of regions which transmit the zero-order light and the higher order light and are different in transmittance from each other.

Figure 17:
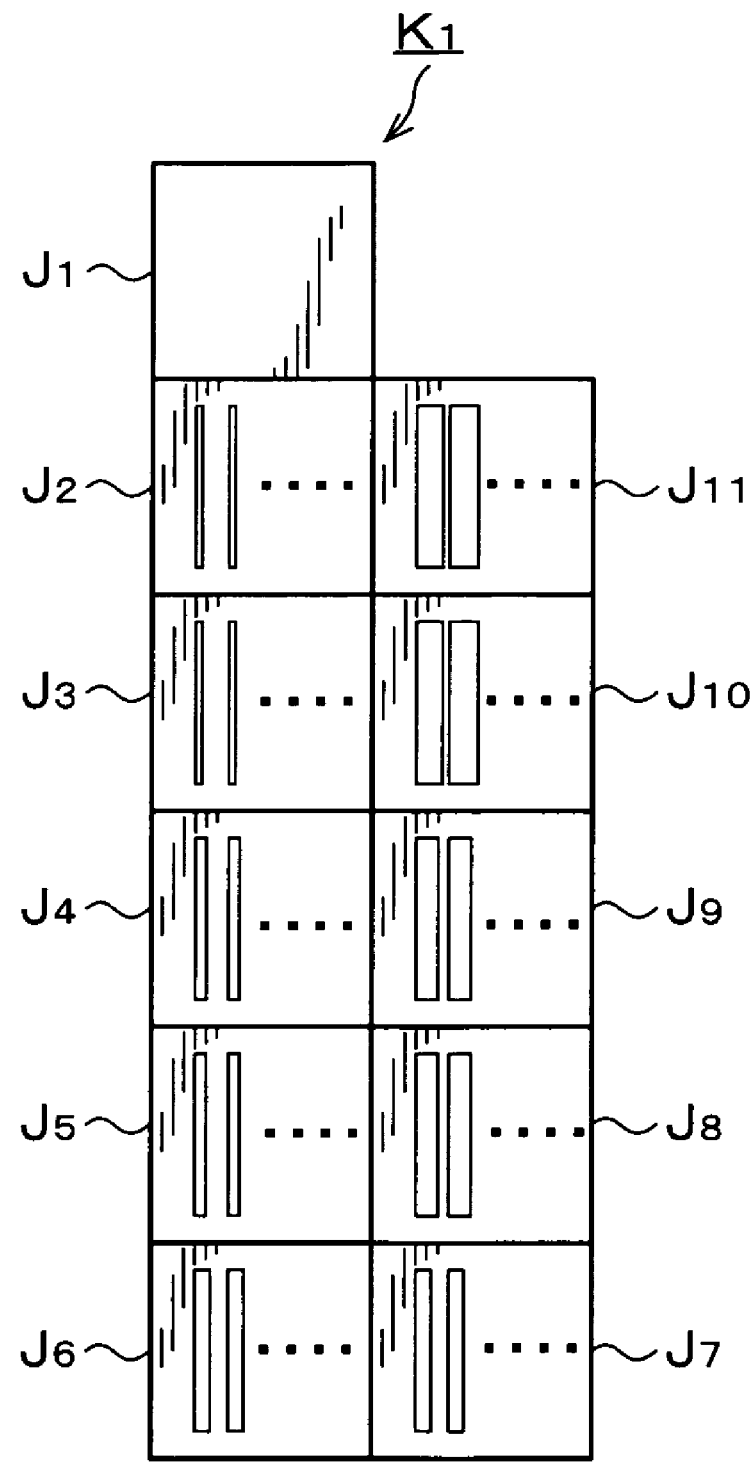
FIG. 17 is a plan view of a first pattern formed with a plurality of regions different in transmittance.
Figure 18:
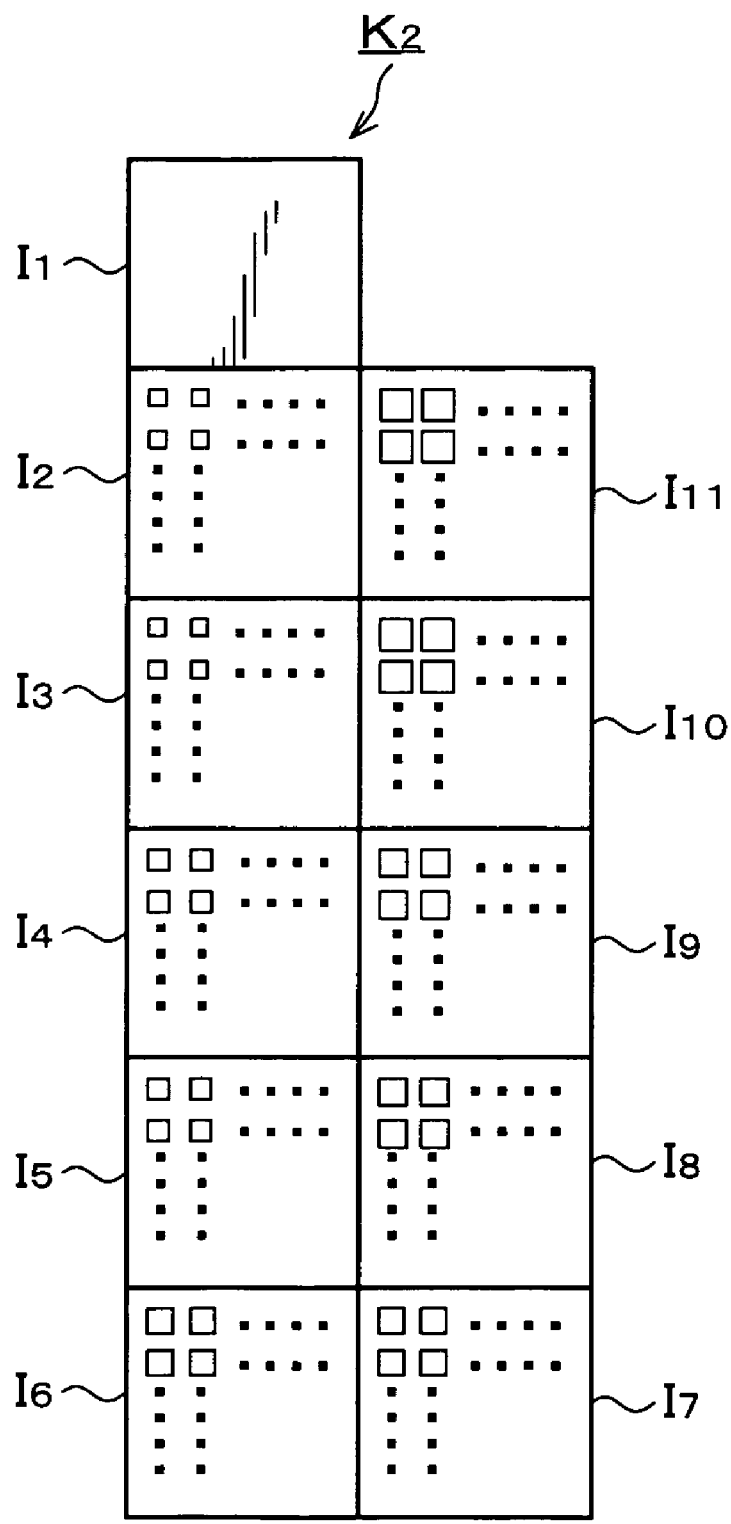
FIG. 18 is a plan view of a second pattern formed with a plurality of regions different in transmittance.

FIG. 17 and FIG. 18 show an example of that pattern, in which a first pattern K1 is formed with, for example, ten regions J2 to J11 different in transmittance as well as a first region J1 transmitting no light as shown in FIG. 17. For example, the regions J1 to J11 are formed such that the transmittance increases on a step-by-step basis from 0% to 100% in increments of 10%. The transmittance of each of the regions J2 to J11 is adjusted by changing the width D1 of the slit V similarly to the above-described pattern B1 shown in FIG. 7. The above-described correlation function H1 between the reduction in film thickness $\Delta A1$ and the line width is obtained for each of the regions J2 to J11, respectively.

As shown in FIG. 18, a second pattern K2 is formed with, for example, ten regions I2 to I11 different in transmittance as well as a first region I1 transmitting no light. For example, the regions I1 to I11 are formed such that the transmittance increases on a step-by-step basis from 0% to 100% in increments of 10%. The transmittance of each of the regions I2 to I11 is adjusted by changing the diameter D2 of the hole N similarly to the above-described pattern B2 shown in FIG. 10. The above-described correlation function H2 between the reduction in film thickness $\Delta A2$ and the line width is obtained for each of the regions I2 to I11, respectively.

At the time of setting the focus condition, a region Jx, that is, any of the regions J2 to J11 in the first pattern K1 is selected according to, for example, the sensitivity of the resist solution in use. In addition, a region Ix, that is, any of the regions I2 to I11 in the second pattern K2 is selected according to, for example, the sensitivity of the resist solution. At the time of measuring the film thickness, in the first portion U1, the film thickness of the portion U1$b$ exposed to light through the selected region Jx and the film thickness of the portion U1$a$ corresponding to the region J1 transmitting no light are measured, and the reduction in film thickness $\Delta A1$ is calculated from the film thickness difference therebetween. In the second portion U2, the film thickness of the portion U2$b$ exposed to light through the selected region Ix and the film thickness of the portion U2$a$ corresponding to the region I1 transmitting no light are measured, and the reduction in film thickness $\Delta A2$ is calculated from the film thickness difference therebetween. Thereafter, the reduction in film thickness $\Delta A1$ is converted into the line width CD1 by the correlation function H1 corresponding to the region Jx, and the reduction in film thickness $\Delta A2$ is converted into the line width CD2 by the correlation function H2 corresponding to the region Ix. From the difference between the line width CD2 and the line width CD1, the line width CD depending on the focus component is then calculated as described above, so that the focus correction value $\Delta F$ is calculated based on the line width CD.

In this case, even when a plurality of kinds of resist solutions different in sensitivity are used in the above-described photolithography process, the resist films are allowed to remain surely by using any of the regions J2 to J11 and any of the regions I2 to I11 which are different in transmittance. Accordingly, the reduction in film thickness of the resist film can be measured even without replacing one mask 152 with another every time the resist solution is changed.

Although the reduction in film thickness $\Delta A1$ in the first portion U1 and the reduction in film thickness $\Delta A2$ in the second portion U2 of the resist film are converted by the correlation functions H1 and H2 in the above embodiment, the film thickness A1$b$ of the portion U1$b$ reduced by the exposure in the first portion U1 and the film thickness A2$b$ of the portion U2$b$ reduced by the exposure in the second portion U2 may be directly converted into the line widths. In this case, the film thickness A1$b$ and the film thickness A2$b$ are converted into the line widths by previously obtained correlation functions between the film thicknesses and the line widths.

One example of the embodiment of the present invention has been described, but the present invention is not limited to the example and may take various forms. For example, the present invention is also applicable to setting of the focus condition in the photolithography process of substrates other than the wafer, such as an FPD (Flat Panel Display), a mask reticule for a photomask, and so on.

The present invention is useful in accurately setting the focus condition at the time of exposure based on an optimum line width.

What is claimed is:

1. A method of setting a focus condition at the time of exposure in a photolithography process of forming a resist pattern on a substrate, comprising the steps of:
    exposing a film on the substrate to light using a mask having a first pattern transmitting only zero-order light of a light source and then developing the film to reduce a first portion of the resist pattern of the film on the substrate in the photolithography process in which a certain focus condition has been already set;
    exposing the film on the substrate to light using the mask having a second pattern transmitting zero-order light and higher order light of the light source and then developing the film to reduce a second portion of the resist pattern of the film on the substrate in the photolithography process in which the certain focus condition has been already set;
    measuring film thicknesses of the first portion and the second portion;
    reading information of a previously obtained correlation between film thicknesses of the first and second portions and line widths of the resist pattern from a storage unit in which said information of the previously obtained correlation is stored;
    converting the measured film thickness of the first portion and the measured film thickness of the second portion into line widths of the resist pattern by said information of the previously obtained correlation stored in said storage unit;
    subtracting the converted line width of the second portion from the converted line width of the first portion; and
    setting a new focus condition based on a line width difference resulting from the subtraction.

2. The method of setting a focus condition at the time of exposure as set forth in claim 1, further comprising the step of:
    calculating a reduction in film thickness of the first portion and a reduction in film thickness of the second portion from results of the measurement of the film thicknesses, wherein the calculated reduction in film thickness of the first portion and the calculated reduction in film thickness of the second portion are converted into the line widths of the resist pattern by previously obtained correlations between the reductions in film thicknesses and the line widths in place of the correlations between the film thicknesses and the line widths.

3. A method of setting a focus condition at the time of exposure in a photolithography process of forming a resist pattern on a substrate, comprising the steps of:
    exposing a film on the substrate to light using a mask having a first pattern transmitting only zero-order light of a light source and then developing the film to reduce a first portion of the resist pattern of the film on the substrate in the photolithography process in which a certain focus condition has been already set;
    exposing the film on the substrate to light using the mask having a second pattern transmitting zero-order light and higher order light of the light source and then developing the film to reduce a second portion of the resist pattern of the film on the substrate in the photolithography process in which the certain focus condition has been already set;
    measuring film thicknesses of the first portion and the second portion;
    subtracting the film thickness of the second portion from the film thickness of the first portion to calculate a film thickness difference therebetween based on results of the measurement of the film thicknesses;
    reading information of a previously obtained correlation between a film thickness difference of the first and second portions and a line width of the resist pattern from a storage unit in which said information of the previously obtained correlation is stored;
    converting the calculated film thickness difference into a line width of the resist pattern by said information of the previously obtained correlation stored in said storage unit; and
    setting a new focus condition based on the converted line width.

4. The method of setting a focus condition at the time of exposure as set forth in claim 3, wherein:
    a reduction in film thickness of the first portion and a reduction in film thickness of the second portion are calculated based on the results of the measurement of the film thicknesses; and
    the film thickness difference between the first portion and the second portion is calculated from the reduction in film thickness of the first portion and the reduction in film thickness of the second portion.

5. The method of setting a focus condition at the time of exposure as set forth in claim 2, wherein:
    the first pattern is formed with a region transmitting the zero-order light of the light source and a region not transmitting the light of the light source;
    the second pattern is formed with a region transmitting the zero-order light and the higher order light of the light source and a region not transmitting the light of the light source;
    the reduction in film thickness of the first portion is obtained by calculating a film thickness difference between portions in the first portion of the film corresponding to the two regions of the first pattern; and
    the reduction in film thickness of the second portion is obtained by calculating a film thickness difference between portions in the second portion of the film corresponding to the two regions of the second pattern.

6. The method of setting a focus condition at the time of exposure as set forth in claim 5, wherein:
    the first pattern is formed with a plurality of regions which transmit the zero-order light and are different in transmittance; and
    the second pattern is formed with a plurality of regions which transmit the zero-order light and the higher order light and are different in transmittance.

7. The method of setting a focus condition at the time of exposure as set forth in claim 4, wherein:
    the first pattern is formed with a region transmitting the zero-order light of the light source and a region not transmitting the light of the light source;
    the second pattern is formed with a region transmitting the zero-order light and the higher order light of the light source and a region not transmitting the light of the light source;

the reduction in film thickness of the first portion is obtained by calculating a film thickness difference between portions in the first portion of the film corresponding to the two regions of the first pattern; and the reduction in film thickness of the second portion is obtained by calculating a film thickness difference between portions in the second portion of the film corresponding to the two regions of the second pattern.

8. The method of setting a focus condition at the time of exposure as set forth in claim 7, wherein:

the first pattern is formed with a plurality of regions which transmit the zero-order light and are different in transmittance; and the second pattern is formed with a plurality of regions which transmit the zero-order light and the higher order light and are different in transmittance.

9. An apparatus for setting a focus condition at the time of exposure in a photolithography process of forming a resist pattern on a substrate, comprising:

a mask for exposure having a first pattern transmitting only zero-order light of a light source and a second pattern transmitting zero-order light and higher order light of the light source;

a film thickness measuring unit for measuring a film thickness when a film on the substrate is exposed to only the zero-order light of the light source transmitted through the mask and then developed to reduce a first portion of the resist pattern of the film on the substrate in the photolithography process in which a certain focus condition has been already set, and a film thickness when the film on the substrate is exposed to the zero-order light and the higher order light of the light source transmitted through the mask and then developed to reduce a second portion of the resist pattern of the film on the substrate in the photolithography process in which the certain focus condition has been already set;

a storage unit for storing information of a previously obtained correlation between film thicknesses of the first and second portions and line widths of the resist pattern; and a setting unit for converting the measured film thickness of the first portion and the measured film thickness of the second portion into line widths of the resist pattern by said information of the previously obtained correlation stored in said storage unit, subtracting the converted line width of the second portion from the converted line width of the first portion, and setting a new focus condition based on a line width difference resulting from the subtraction.

10. The apparatus for setting a focus condition at the time of exposure as set forth in claim 9, wherein:

said setting unit calculates a reduction in film thickness of the first portion and a reduction in film thickness of the second portion from results of the measurement of the film thicknesses, and converts the calculated reduction in film thickness of the first portion and the calculated reduction in film thickness of the second portion into line widths of the resist pattern by previously obtained correlations between the reductions in film thicknesses and the line widths.

11. An apparatus for setting a focus condition at the time of exposure in a photolithography process of forming a resist pattern on a substrate, comprising:

a mask for exposure having a first pattern transmitting only zero-order light of a light source and a second pattern transmitting zero-order light and higher order light of the light source;

a film thickness measuring unit for measuring a film thickness when a film on the substrate is exposed to only the zero-order light of the light source transmitted through the mask and then developed to reduce a first portion of the resist pattern of the film on the substrate in the photolithography process in which a certain focus condition has been already set, and a film thickness when the film on the substrate is exposed to the zero-order light and the higher order light of the light source transmitted through the mask and then developed to reduce a second portion of the resist pattern of the film on the substrate in the photolithography process in which the certain focus condition has been already set;

a storage unit for storing information of a previously obtained correlation between a film thickness difference of the first and second portions and a line width of the resist pattern; and a setting unit for subtracting the film thickness of the second portion from the film thickness of the first portion to calculate a film thickness difference therebetween based on results of the measurement of the film thicknesses, converting the calculated film thickness difference into a line width of the resist pattern by said information of the previously obtained correlation stored in said storage unit, and setting a new focus condition based on the converted line width.

12. The apparatus for setting a focus condition at the time of exposure as set forth in claim 11, wherein said setting unit calculates a reduction in film thickness of the first portion and a reduction in film thickness of the second portion from the results of the measurement of the film thicknesses, and calculates the film thickness difference between the first portion and the second portion from the reduction in film thickness of the first portion and the reduction in film thickness of the second portion.

13. The apparatus for setting a focus condition at the time of exposure as set forth in claim 10, wherein:

the first pattern is formed with a region transmitting the zero-order light of the light source and a region not transmitting the light of the light source;

the second pattern is formed with a region transmitting the zero-order light and the higher order light of the light source and a region not transmitting the light of the light source; and said setting unit calculates a film thickness difference between portions in the first portion of the film corresponding to the two regions of the first pattern to obtain the reduction in film thickness of the first portion, and calculates a film thickness difference between portions in the second portion of the film corresponding to the two regions of the second pattern to obtain the reduction in film thickness of the second portion.

14. The apparatus for setting a focus condition at the time of exposure as set forth in claim 12, wherein the first pattern is formed with a region transmitting the zero-order light of the light source and a region not transmitting the light of the light source;

the second pattern is formed with a region transmitting the zero-order light and the higher order light of the light source and a region not transmitting the light of the light source; and said setting unit calculates a film thickness difference between portions in the first portion of the film corresponding to the two regions of the first pattern to obtain the reduction in film thickness of the first portion, and calculates a film thickness difference between portions in the second portion of the film corresponding to the two regions of the second pattern to obtain the reduction in film thickness of the second portion.

15. An apparatus for setting a focus condition at the time of exposure in a photolithography process of forming a resist pattern on a substrate, comprising:

a mask for exposure having a first pattern transmitting only zero-order light of a light source and a second pattern transmitting zero-order light and higher order light of the light source;

a film thickness measuring unit for measuring a film thickness when a film on the substrate is exposed to only the zero-order light of the light source transmitted through the mask and then developed to reduce a first portion of the resist pattern of the film on the substrate in the photolithography process in which a certain focus condition has been already set, and a film thickness when the film on the substrate is exposed to the zero-order light and the higher order light of the light source transmitted through the mask and then developed to reduce a second portion of the resist pattern of the film on the substrate in the photolithography process in which the certain focus condition has been already set;

a storage unit for storing information of a previously obtained correlation between the thicknesses of the first and second portions and line widths of the resist pattern; and a setting unit for calculating a reduction in film thickness of the first portion and a reduction in film thickness of the second portion from results of the measurement of the film thicknesses, converting the calculated reduction in film thickness of the first portion and the calculated reduction in film thickness of the second portion into line widths of the resist pattern by said information of correlation stored in said storage unit, subtracting the converted line width of the second portion from the converted line width of the first portion, and setting a new focus condition based on a line width difference resulting from the subtraction, wherein the first pattern is formed with a plurality of regions which transmit the zero-order light and are different in transmittance, and a region not transmitting the light of the light source, the second pattern is formed with a plurality of regions which transmit the zero-order light and the higher order light and are different in transmittance, and a region not transmitting the light of the light source, and said setting unit calculates a film thickness difference between portions in the first portion of the film, which correspond to the region transmitting the zero-order light of the light source and the region not transmitting the light of the light source, of the first pattern to obtain the reduction in film thickness of the first portion, and calculates a film thickness difference between portions in the second portion of the film, which correspond to a region transmitting the zero-order light and the higher order light of the light source and a region not transmitting the light of the light source, of the second pattern to obtain the reduction in film thickness of the second portion.

16. An apparatus for setting a focus condition at the time of exposure in a photolithography process of forming a resist pattern on a substrate, comprising:

a mask for exposure having a first pattern transmitting only zero-order light of a light source and a second pattern transmitting zero-order light and higher order light of the light source, a film thickness measuring unit for measuring a film thickness when a film on the substrate is exposed to only the zero-order light of the light source transmitted through the mask and then developed to reduce a first portion of the resist pattern of the film on the substrate in the photolithography process in which a certain focus condition has been already set, and a film thickness when the film on the substrate is exposed to the zero-order light and the higher order light of the light source transmitted through the mask and then developed to reduce a second portion of the resist pattern of the film on the substrate in the photolithography process in which the certain focus condition has been already set;

a storage unit for storing information of a previously obtained correlation between film thicknesses of the first and second portions and line widths of the resist pattern; and a setting unit for calculating a reduction in film thickness of the first portion and a reduction in film thickness of the second portion from the results of the measurement of the film thicknesses, calculating the film thickness difference between the first portion and the second portion from the reduction in film thickness of the first portion and the reduction in film thickness of the second portion, converting the calculated film thickness difference into a line width of the resist pattern by said information of correlation stored in said storage unit, and setting a new focus condition based on the converted line width, wherein the first pattern is formed with a plurality of regions which transmit the zero-order light and are different in transmittance, and a region not transmitting the light of the light source, the second pattern is formed with a plurality of regions which transmit the zero-order light and the higher order light and are different in transmittance, and a region not transmitting the light of the light source, and said setting unit calculates a film thickness difference between portions in the first portion of the film, which correspond to the region transmitting the zero-order light of the light source and the region not transmitting the light of the light source, of the first pattern to obtain the reduction in film thickness of the first portion and calculates a film thickness difference between portions in the second portion of the film, which correspond to a region transmitting the zero-order light and the higher order light of the light source and a region not transmitting the light of the light source, of the second pattern to obtain the reduction in film thickness of the second portion.

17. A computer readable recording medium recording thereon a computer program product for causing a computer to realize a function of a setting unit in an apparatus for setting a focus condition at the time of exposure in a photolithography process of forming a resist pattern on a substrate, said setting apparatus including:

a mask for exposure having a first pattern transmitting only zero-order light of a light source and a second pattern transmitting zero-order light and higher order light of the light source;

a film thickness measuring unit for measuring a film thickness when a film on the substrate is exposed to only the zero-order light of the light source transmitted through the mask and then developed to reduce a first portion of the resist pattern of the film on the substrate in the photolithography process in which a certain focus condition has been already set, and a film thickness when the film on the substrate is exposed to the zero-order light and the higher order light of the light source transmitted through the mask and then developed to reduce a second portion of the resist pattern of the film on the substrate in the photolithography process in which the certain focus condition has been already set;

the setting unit; and a storage unit for storing information of a previously obtained correlation between film thicknesses of the first and second portions and line widths of the resist pattern, and said computer program product comprising:

computer readable program code means for causing the computer to convert the measured film thickness of the first portion and the measured film thickness of the second portion into line widths of the resist pattern by said information of the previously obtained correlation stored in said storage unit, subtracting the converted line width of the second portion from the converted line width of the first portion, and setting a new focus condition based on a line width difference resulting from the subtraction, in the setting unit.

* * * * *